(12) United States Patent
Lin et al.

(10) Patent No.: US 6,274,911 B1
(45) Date of Patent: Aug. 14, 2001

(54) CMOS DEVICE WITH DEEP CURRENT PATH FOR ESD PROTECTION

(75) Inventors: Geeng-Lih Lin; Ming-Dou Ker, both of Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/709,588

(22) Filed: Nov. 13, 2000

Related U.S. Application Data

(62) Division of application No. 09/249,256, filed on Feb. 12, 1999, now Pat. No. 6,169,001.

(51) Int. Cl.[7] .................................................. H01L 23/62
(52) U.S. Cl. ........................... 257/358; 257/360; 257/363
(58) Field of Search .................................... 257/356, 357, 257/358, 360, 363

(56) References Cited

U.S. PATENT DOCUMENTS

| | | |
|---|---|---|
| 5,219,770 * | 6/1993 | Shirato et al. |
| 5,416,351 * | 5/1995 | Ito et al. ............................. 257/357 |
| 5,440,162 * | 8/1995 | Workey et al. ..................... 257/355 |
| 5,446,302 | 8/1995 | Beigel et al. ....................... 257/355 |
| 5,616,943 | 4/1997 | Nguyen et al. ..................... 257/355 |
| 5,637,901 | 6/1997 | Beigel et al. ....................... 257/355 |
| 5,677,205 | 10/1997 | Williams et al. ..................... 437/15 |
| 5,932,897 * | 8/1999 | Kawaguchi et al. ................ 257/141 |

\* cited by examiner

*Primary Examiner*—Ngân V. Ngô
(74) *Attorney, Agent, or Firm*—George O. Saile; Stephen B. Ackerman

(57) ABSTRACT

In this invention a current block is implanted into the drain of a transistor to provide for ESD protection and allow the shrinking of the transistor. The block increases the current path into the semiconductor bulk and increases heat dissipation capability. The current block is created by implanting P+ into a region in an N+ drain, and through the drain into an N-well laying below the drain. A high resistance of the block forces drain current flowing from the channel to the drain contact into the semiconductor bulk. The block is the fill width of the drain spreading out the current from an ESD and forcing current from the channel down into the N-well, under the block, and back up to the drain contact area. The increased path and the spreading of the drain current through the semiconductor bulk enhances heat dissipation, and allows smaller devices and layout area with ESD protection.

5 Claims, 2 Drawing Sheets

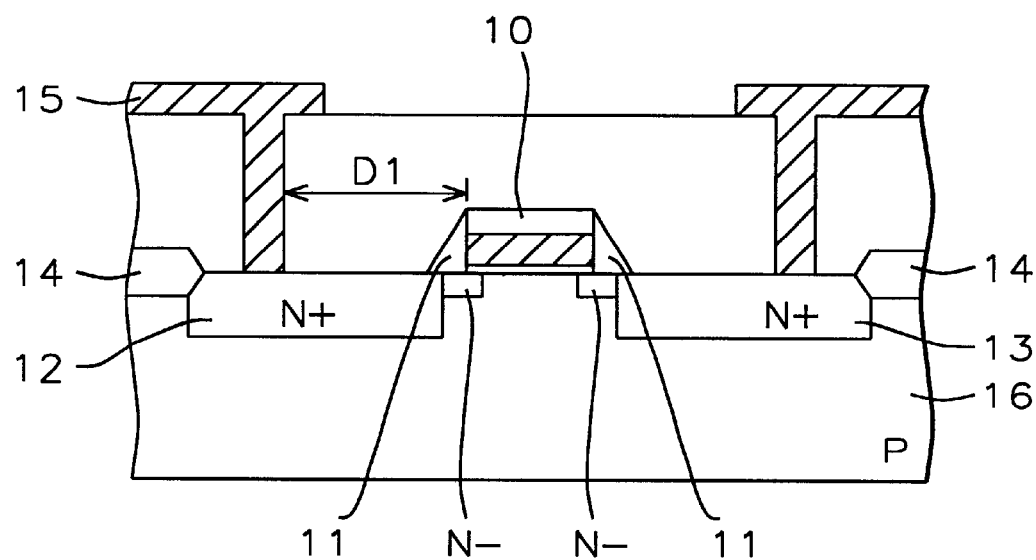
FIG. 1 – Prior Art
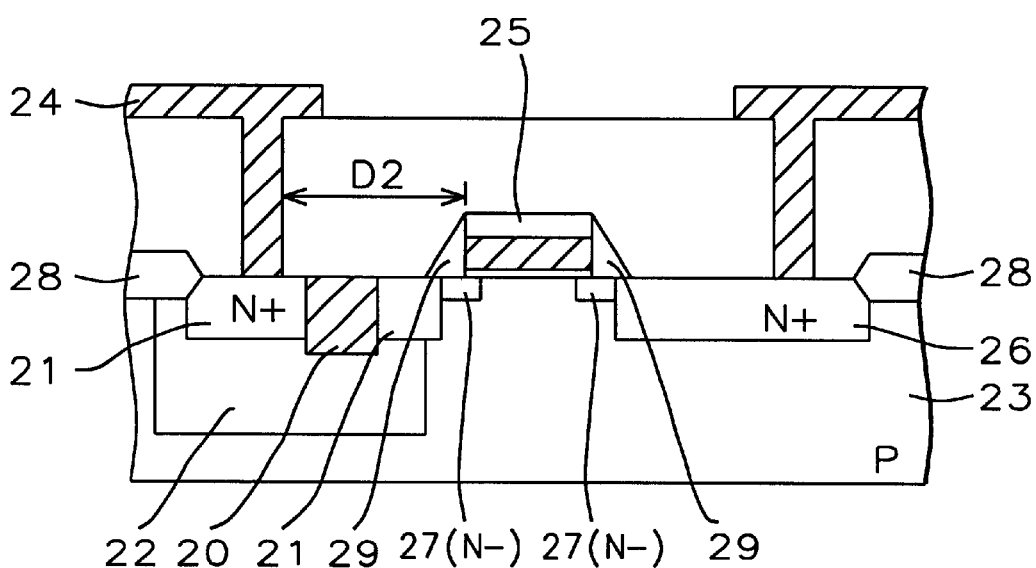
FIG. 2

CMOS DEVICE WITH DEEP CURRENT PATH FOR ESD PROTECTION

This is a division of patent application Ser. No. 09/249,256, filing date Feb. 12, 1999, now U.S. Pat. No. 6,169,001 Cmos Debvice With Deep Current Path For Esd Protection, assigned to the same assignee as the present invention.

BACKGROUND OF THE INVENTION

1. Field of Invention

This invention pertains to semiconductor devices and in particular the protection from electrostatic discharge.

2. Description of Related Art

As the level of integration of semiconductor product has grown, device structures have shrunk leaving less volume of material to dissipate heating from current surges caused by electrostatic discharge (ESD). Keeping input and output devices large enough to dissipate the energy from an ESD uses a lot of valuable semiconductor real estate. Various attempts have been made to change the path of the discharge current and provide a way to absorb the energy while allowing the transistor devices to get smaller.

In U.S. Pat. No. 5,416,351 (Ito et al.) a Zener diode is embedded into the drain of a MOS device as an ESD protection device. The ESD protection device provides a low voltage trigger for avalanche breakdown to discharge the ESD current away from the drain. In U.S. Pat. No. 5,446,302 (Beigel et al.) and U.S. Pat. No. 5,637,901 (Beigel et al) a diode connected bipolar transistor device is disclosed that provides protection from ESD. The device functions as a transistor in the active region an ESD event with the current path from collector to emitter and lowering the ESD current density. In U.S. Pat. No. 5,616,943 (Nguyen et al.) ESD protection is described for a mixed voltage circuit and having multiple isolated power supplies. This is accomplished by making use of several overload protection devices. In U.S. Pat. No. 5,677,205 (Williams et al.) an ESD device is discussed which includes a pair of depletion mode MOSFET transistors are connected drain to drain in series with a path from a circuit input terminal to a circuit output terminal. A pair of diodes are connected between ground and the transistors. One diode breaks down during large voltage spikes of short duration and the other diode breaks down during relatively low voltage long duration surges.

When an electrostatic discharge happens, heating takes place in the area of the drain. This is a result of a junction breakdown at the drain which allows a large amount of current to flow. If the current is not spread out across a sufficiently large volume, the resulting heat will not be dissipated and damage to the device will result. As semiconductor devices are shrunk and integrated together in larger and larger quantities, the sensitivity to ESD becomes worse. A way is described in this invention allow small devices and at the same time permit adequate dissipation of heat from an electrostatic discharge.

SUMMARY OF THE INVENTION

In this invention a resistive block is created by implanting P+ into an area of an N+ drain to divert current flowing from the channel to the drain contact close to the surface of the semiconductor and force it deeper into the bulk of the substrate. The P+ and N+ dopants compensate each other and produce a region of low dopant level but with a high resistance to current flow that is called a "resistive block". In creating the resistive block, a longer path for the current through a larger volume of semiconductor material is created to effect adequate dissipation of the heating caused by an ESD. The resistive block is implanted through the drain into an N-well that is located below the drain in the substrate. The resistive block runs the full width of the drain to spread out the current, and to dissipate into the semiconductor substrate by forcing the current to flow into the bulk of a semiconductor. The resulting longer current path provides a way to dissipate energy from an electrostatic discharge and at the same time allow shrinking of transistor dimensions.

To produce the resistive current block, an N-well is implanted into the P substrate under a drain region of a transistor that is to be protected from an ESD. The N-well extends the length and width of the drain area as defined by the gate structure with sidewalls and the surrounding field oxide. After the N-well is implanted, an active area within the field oxide is formed and a gate structure is formed within the active area. The N+ drain and source are ion implanted. Photoresist is then applied to the surface of the wafer, and an area within the drain is masked open to allow the resistive current block to be implanted into the drain and through to the N-well. When current from the channel flow toward the drain contact area, the resistive block detours current down through the N+ drain, into the N-well, under the resistive block, and back up through the N+ drain to the drain contact area This extra path length into the semiconductor bulk provides more material to dissipate the heat from and ESD.

Although a resistive current block in an N+ drain has been described, a resistive current block created by an N+ implant through a P+ drain into a P-well on an N substrate could also be used to protect a P-channel transistor from ESD damage due to excessive heating from the current discharge. The process steps are similar although the material is of opposite type.

BRIEF DESCRIPTION OF THE DRAWINGS

This invention will be described with reference to the accompanying drawings, wherein:

FIG. 1 is a cross section view of a prior art transistor structure using spacing of the drain contact pad from the gate structure to provide ESD protection;

FIG. 2 is a cross section view of a transistor structure with the ESD protection structure of this invention.

DETAILED DESCRIPTION OF THE PREFERRED EMBODIMENT

Figure 3:
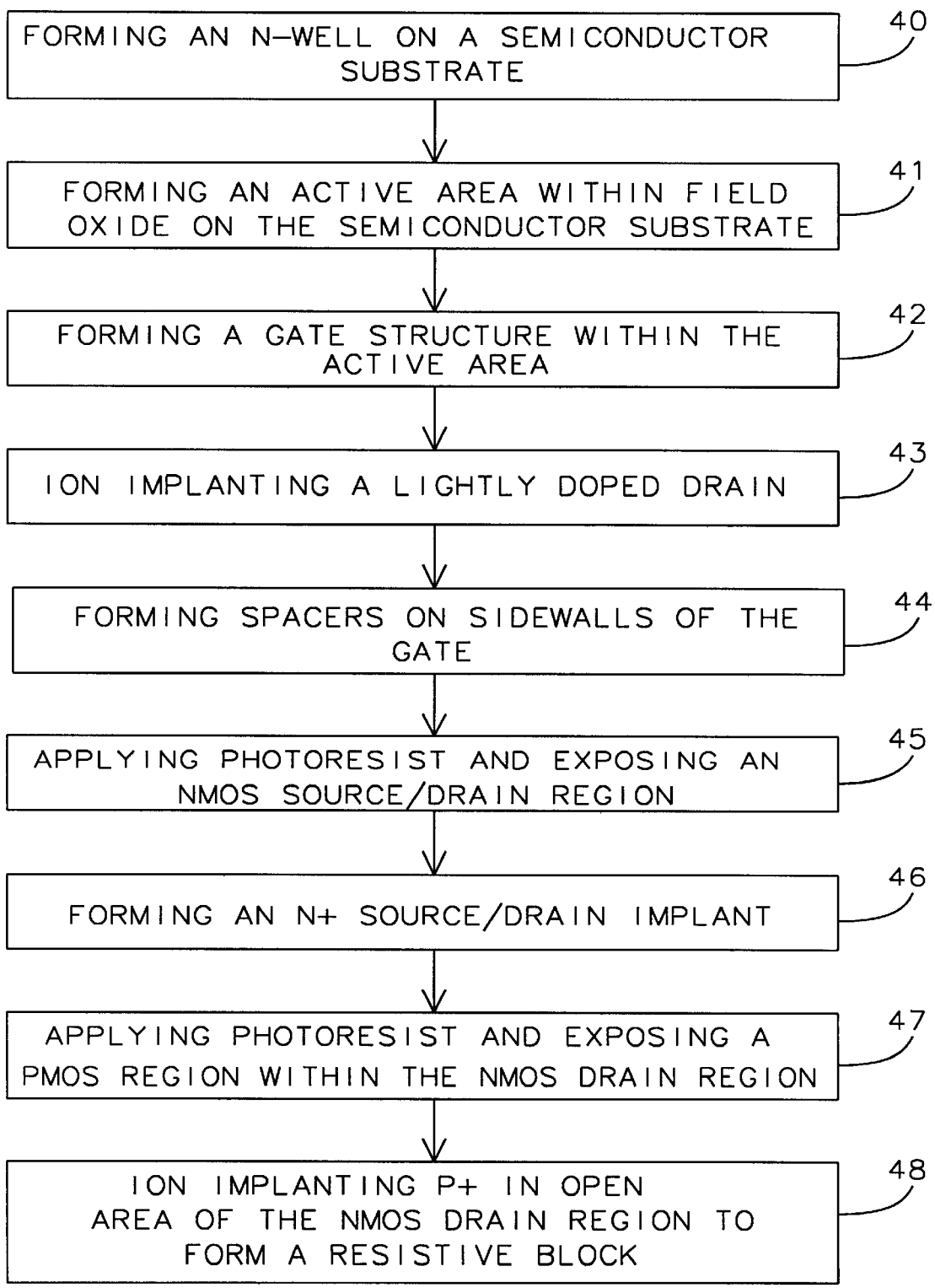
FIG. 3 is a flow diagram of the method to create the ESD protection structure of this invention.

In FIG. 1 is shown a cross section view of a transistor of prior art. A gate structure 10 including sidewall spacers 11 along with field oxide 14 define source 13 and drain 12 areas on a P substrate 16. The drain contact 15 is located a distance D1 from the gate structure 10. The distance D1 is determined by the amount of heat dissipation needed to prevent damage from an ESD and restricts the shrinkage of the transistor size.

In FIG. 2 is shown a cross section view of a transistor of this invention with a resistive block 20 formed by a P+ ion implantation into the N+ drain 21 to force the flow of drain current through the drain 21 and into an N-well 22 within the bulk of the substrate 23. The width of the resistive block 20 is the same a the transistor device width of a range of approximately about 200 to 500 $\mu$m, and the length is from approximately about 0.5 to 5 µm. The P+ ion implant is done at a concentration of approximately about 2E15 to 4E15 ions per square centimeter using an energy of approximately about 20 to 50 Kev. The resulting dopant level concentration of the resistive block 20 is approximately about 1E10 which is a result of the compensation between the N+ and P+ implants.

Continuing to refer to FIG. 2, the low level concentration of resistive block 20 caused by compensation of the N+ and P+ implants form a high resistance to the flow of current and force the current to seek a path of least resistance which is down through the drain 21, into the N-well 22, under the resistive block 20 and back up through the drain 21 to the drain contact 24. The resistive block 20 runs the full width of the drain 21 and spreads out the current allowing additional material dissipate the heat from an ESD. The spreading of the drain current and the longer path through the bulk of the substrate 23 allows the distance D2 from the gate structure 25 to the drain contact 26 to be shorter that the distance D1 shown in FIG. 1. This allows smaller transistors and layout area to be designed with ESD protection.

Continuing to refer to FIG. 2, the ESD protected transistor is created by first forming an N-well 22 into a semiconductor substrate, and then forming a gate structure 25 within an opening in field oxide 28 on the P substrate 23. A lightly doped drain (LDD) 27 is implanted into the substrate 23 using the gate structure 25 and the field oxide 28 as a mask. Sidewalls 29 are added to the gate structure 25 and the heavily doped drain 21 and source 26 are next ion implanted using the gate structure 25 with sidewalls 29 and the field oxide as a mask. Photoresist is then applied and an opening is made to ion implant the resistive Block 20 in the drain region 21, down through the drain 21 and into the N-well 22.

In FIG. 3 is shown a method for creating a resistive block for ESD protection of a transistor. An N-well is formed on a semiconductor substrate 40. An active area is formed within the field oxide on top of a semiconductor substrate and encompassing the N-well 41. A gate structure comprising a layer of oxide under a layer of polysilicon is formed within the active area 42. Then a lightly doped drain is ion implanted using the gate structure and the field oxide as a mask 43; although, the lightly doped drain can be eliminated from the process without effecting the final results of forming a resistive block to provide ESD protection. Sidewall spacers are formed on the gate structure extending from the surface of the substrate to the layer of oxide covering the layer of polysilicon 44. Photoresist is applied to the substrate and an NMOS source/drain region is exposed 45. Next the N+ doped drain and source are formed 46 using the gate structure with sidewalls and the field oxide as a mask Photoresist is again applied and a PMOS region within the NMOS drain region is exposed 47. A resistive block is formed by ion implanting in the PMOS region within the NMOS drain region 48. The resistive block extends through the heavily doped drain and into the underlying N-well. The resistive block is within the length of the drain and is formed over the full width of the drain bounded by field oxide at either end. The formation of the resistive block spreads the drain current and diverts it down through the drain into the N-well under the resistive block and up to the drain contact. This increases the current path into the bulk of the substrate and increases the heat dissipation capability of the transistor to surges in drain current from electrostatic discharge. Smaller transistor devices can be made with ESD protection using the P+ block.

The process shown in FIG. 3 can be used for a P channel transistor on an N substrate by using the opposite type semiconductor material for each element of the semiconductor device. Thus an resistive block can be formed in a P+ drain by ion implanting N+ into a region of the P+ drain and through the P+ drain into a P-well on an N substrate. The resistive block in the P+ drain form a high resistance to drain current. This forces the drain current from the channel to flow down through the P+ drain into the P-well and back up to the drain contact area. The added path length into the semiconductor bulk provides protection from ESD through enhanced heat dissipation capability.

While the invention has been particularly shown and described with reference to preferred embodiments thereof, it will be understood by those skilled in the art that various changes in form and details may be made without departing from the spirit and scope of the invention.

What is claimed is:

1. A CMOS transistor with ESD protection, comprising:
   a) a P substrate containing an N-channel transistor with a gate, a drain and a source,
   b) an N-well diffusion located below said drain of said transistor in the P substrate,
   c) a P+ ion implantation into said drain of the transistor,
   d) said P+ implantation forming a resistive block to the flow of current near the surface of the semiconductor device, and
   e) said resistive block increasing current path into substrate bulk to allow dissipation of heat from an ESD discharge.

2. The transistor of claim 1, wherein the N-well diffusion is contained within a length of the drain and extending across width of said drain.

3. The transistor of claim 1, wherein the P+ ion implantation is through the drain into the N-well located in the P substrate below said drain.

4. The transistor of claim 1, wherein the P+ ion implantation extends the width of drain region and is located between said gate and contact pad for electrical connections to said drain.

5. The transistor of claim 1, wherein an N+ ion implantation can be formed in a P+ drain and through to a P-well under said P+ drain on an N substrate providing ESD protection for a P-channel transistor.

* * * * *